(12) United States Patent
Takagi

(10) Patent No.: US 7,980,296 B2
(45) Date of Patent: Jul. 19, 2011

(54) HEAT EXCHANGER, LIGHT SOURCE DEVICE, PROJECTOR AND ELECTRONIC APPARATUS

(75) Inventor: Kunihiko Takagi, Okaya (JP)

(73) Assignee: Seiko Epson Corporation, Tokyo (JP)

( * ) Notice: Subject to any disclaimer, the term of this patent is extended or adjusted under 35 U.S.C. 154(b) by 934 days.

(21) Appl. No.: 11/636,584

(22) Filed: Dec. 11, 2006

(65) Prior Publication Data

US 2007/0165190 A1    Jul. 19, 2007

(30) Foreign Application Priority Data

Dec. 16, 2005 (JP) .................................. 2005-364078

(51) Int. Cl.
*F28F 3/08* (2006.01)
(52) U.S. Cl. ........... 165/167; 165/166; 165/168; 353/61
(58) Field of Classification Search .............. 353/57–61; 29/890.39; 165/80.4, 166–168
See application file for complete search history.

(56) References Cited

U.S. PATENT DOCUMENTS

| | | | |
|---|---|---|---|
| 1,992,097 A * | 2/1935 | Seligman | 165/167 |
| 4,195,687 A * | 4/1980 | Taziker | 165/129 |
| 5,125,451 A | 6/1992 | Matthews | |
| 5,232,047 A | 8/1993 | Matthews | |
| 5,263,251 A | 11/1993 | Matthews | |
| 5,274,920 A * | 1/1994 | Matthews | 29/890.039 |
| 6,865,081 B2 | 3/2005 | Meyer et al. | |
| 7,044,198 B2 | 5/2006 | Matsushima et al. | |
| 7,231,960 B2 | 6/2007 | Sakai | |
| 2005/0061494 A1 * | 3/2005 | Tsuji et al. | 165/173 |
| 2005/0254013 A1 * | 11/2005 | Engle et al. | 353/52 |
| 2006/0096299 A1 | 5/2006 | Mamitsu et al. | |

FOREIGN PATENT DOCUMENTS

| | | |
|---|---|---|
| JP | A-06-508911 | 10/1994 |
| JP | A-2003-060145 | 2/2003 |
| JP | A-2004-128457 | 4/2004 |
| JP | A-2004-214623 | 7/2004 |
| JP | A-2005-166737 | 6/2005 |
| JP | A 2005-166855 | 6/2005 |
| JP | A-2006-165534 | 6/2006 |

* cited by examiner

*Primary Examiner* — Que T Le
*Assistant Examiner* — Jerry Brooks
(74) *Attorney, Agent, or Firm* — Oliff & Berridge, PLC

(57) ABSTRACT

A heat exchanger, includes a housing including an inlet passage through which a fluid is introduced, an outlet passage from which the fluid is discharged, an inner communication space in which the fluid flows from the inlet passage and the outlet passage, and a plurality of unit plates of thin flat plates that are disposed in parallel to a flowing direction of the fluid, the plurality of unit plates layered in a direction to be substantially orthogonal to the flowing direction, the plurality of unit plates each having a fin in parallel to the flowing direction of the fluid, a frame enclosing the fin and projecting in an out-of-plane direction of the fin, and holes respectively communicating with the inlet passage and the outlet passage. Heat is exchanged between a heating body attached on an outer surface of the housing and the fluid.

5 Claims, 16 Drawing Sheets

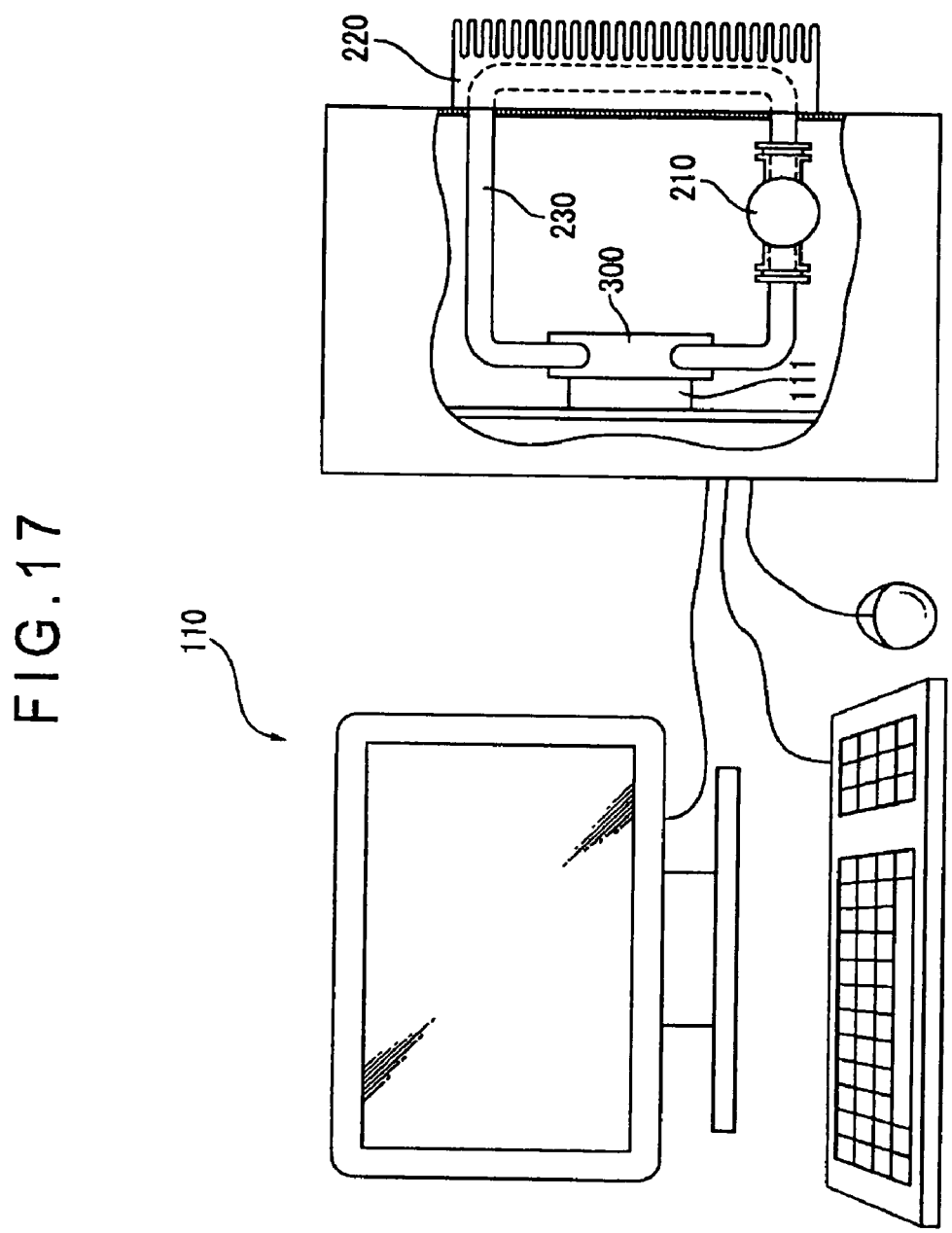

HEAT EXCHANGER, LIGHT SOURCE DEVICE, PROJECTOR AND ELECTRONIC APPARATUS

The entire disclosure of Japanese Patent Application No. 2005-364078, filed Dec. 16, 2005, is expressly incorporated by reference herein.

BACKGROUND

1. Technical Field

The present invention relates to a heat exchanger, a light source device, a projector and an electronic apparatus.

2. Related Art

Projectors have been known as an image projecting device.

The projectors each include a light source and an optical modulation panel which modulates light from the light source for each pixel. The projectors project the light modulated by the optical modulation panel on a screen to display an image.

Recently, LEDs (light-emitting diodes) or LDs (laser diodes), which have characteristics such as immediate lighting and long lifetime, have been considered for use as a light source for the projectors.

However, the LEDs and the LDs generate an extremely large amount of heat and an area of a portion of the LEDs and the LDs from which the heat is generated is extremely small compared with light sources in the related art, which requires a heat exchanger capable of absorbing the large amount of heat from the extremely small area.

As such a heat exchanger, a heat exchanger having a below-described arrangement is known (see, for example, JP-A-2005-166855).

This document discloses the heat exchanger that includes fins inside and circulates a cooling medium inside such that heat is exchanged between the fins and the cooling medium. For the heat exchanger, thin plate members for forming the fins and spacers that are held between the fins for spacing the fins are prepared. The fins and the spacers are made of a metal having a high thermal conductivity and formed by punching. The thin plate members and the spacers are alternately layered and then integrated as a whole by brazing. Consequently, small passages are formed between the fins. While the cooling medium flows through the small passages, heat is efficiently exchanged between the fins and the cooling medium. Since the fins can be processed to be thin, the heat exchanger can have high heat exchange efficiency.

However, as disclosed in the document, the arrangement in which the thin plate members and the spacers are layered requires many joint surfaces. Specifically, one small passage needs two joint surfaces. Such joint surfaces have a low thermal conductivity, hindering heat of a heat generating body from diffusing in a direction in which the thin plate members are layered. Accordingly, fins far from the heat generating body may not become hot enough, so that the thermal conductivity to the fluid may be lowered, thereby lowering the heat exchanging capability of the heat exchanger.

Further, the number of the fins and the spacers is very large, which may cause an increase in component costs and a decrease in assembling efficiency.

SUMMARY

An exemplary aspect of the invention is to provide a heat exchanger that can be manufactured at low cost and that has a high performance.

A heat exchanger according to an aspect of the invention includes: a housing including an inlet passage through which a fluid is introduced, an outlet passage from which the fluid is discharged, an inner communication space in which the fluid flows from the inlet passage and the outlet passage, and a plurality of unit plates of thin flat plates that are disposed in parallel to a flowing direction of the fluid. The plurality of unit plates are layered in a direction to be substantially orthogonal to the flowing direction. The plurality of unit plates each have a fin in parallel to the flowing direction of the fluid. The heat exchanger also includes: a frame enclosing the fin and projecting in an out-of-plane direction of the fin, and holes respectively communicating with the inlet passage and the outlet passage. Heat is exchanged between a heating body attached on an outer surface of the housing and the fluid.

In such an arrangement, the housing having the communication space inside is formed by layering the plurality of unit plates.

Specifically, by jointing surfaces of the frames of the unit plates, an outer surface of the housing is formed. Since the unit plates each are provided with the fin that is disposed in parallel to the flowing direction of the fluid, the plurality of fins are disposed (in the communication space) inside the housing formed by layering the plurality of unit plates. Accordingly the small passages are formed between the fins. The heating body is attached on the outer surface of the thus assembled heat exchanger. The heating body may be a heat generating body that generates heat of high temperature or a heat absorber that absorbs heat.

The heat from the heating body is transferred to the outer surface of the heat exchanger and to the fins of the unit plates. In this state, when the fluid is introduced from the inlet passage to the communication space, the fluid flows through the small passages between the fins to the outlet passage. During flowing, the heat is exchanged between the fins and the fluid via the contact between the fins and the fluid.

In the arrangement, since the plurality of fins are disposed in the communication space in which the fluid flows, a contact area between the fins and the fluid can be large, heat exchange efficiency can be enhanced.

Note that since the housing is formed by layering the unit plates, when the number of joint portions is increased, the thermal conductivity in the joint portions may be lowered. Thereby, the heat from the heating body may not transfer enough in the layering direction, which may be a problem For example, when the fins and the spacers are alternately layered like the related art, one small passage between the fins is formed by jointing one fin with another fin with one spacer interposed, so that two jointing portions are required for one small passage. This means that one hundred jointing portions are necessary to form fifty small passages.

In contrast, in the exemplary aspect of the invention where the fin and the frame are integrally formed to the unit plate, two unit plates can be jointed by one jointing surface to form one small passage. Namely only one jointing portion is necessary for one small passage. In other words, only fifty jointing portions are necessary to form fifty small passages. Accordingly, the number of the joint portions becomes a half of the number in the related art. Thus, since the number of the joint portions can be halved, the thermal conductivity of the heat exchanger can be enhanced, so that the heat of the heating body can be efficiently transferred to the fins of the unit plates. As a result, the heat can be transferred from the fins to the fluid, so that the heat exchanger can have high heat exchange efficiency.

According to the exemplary aspect of the invention, since the fin and the frame are integral, the number of components can be halved compared with the related art, halving assembling work.

Hence, the manufacturing cost of the heat exchanger can be low and the heat exchanger can have a high performance.

The unit plates may be made of copper, aluminum or an alloy of copper or aluminum which have a high thermal conductivity.

For example, diffusion jointing may be employed to joint the unit plates.

According to the exemplary aspect of the invention, the frame may be provided so as to project toward one of a front surface side and a rear surface side of the fin, and the unit plates each have a C-shape in cross section.

According to the exemplary aspect of the invention, since the frame of the unit plate projects in one direction relative to the fin, the small passages can be formed by layering the unit plates such that the respective projecting directions of the frames of the unit plates are the same, thereby forming the heat exchanger.

According to the exemplary aspect of the invention, the frame may be provided so as to project toward both of the front surface side and the rear surface side of the fin, and the unit plates each have an I-shape in cross section.

According to the exemplary aspect of the invention, when the unit plates are layered, the small passages are formed between the fins, thereby forming the heat exchanger.

Note that in forming the unit plates having the I-shape in cross section, the frame may be formed so as to project by pressing the thin plate from both of the front and rear surfaces to thin the fin, for example.

When the frame is formed by pressing the thin plate so as to project by an amount in which the fin is thinned, a height of the frame (a projecting height from the fin) can be extremely thin. Accordingly, the small passage can be thin by reducing the distance between the fins when layering the unit plates. As a result, since the contact area between the fins and the fluid can be increased, the thermal conductivity from the fins to the fluid can be enhanced, thereby enhancing the performance of the heat exchanger.

According to the exemplary aspect of the invention, the frame may be provided so as to project toward both of the front surface side and the rear surface side of the fin and such that a projecting direction of the frame is slant relative to the surfaces of the fin, and the unit plates each have a Z-shape in cross section.

In the arrangement, since the frame is slant relative to the fin, the area of the fin can be larger. Accordingly, since the contact area between the fluid and the fin having a larger area can be increased, the thermal conductivity from the fins to the fluid can be enhanced.

According to the aspect of the invention, the heat exchanger may further include a fin plate having a fin in parallel to the flowing direction of the fluid and holes respectively communicating with the inlet passage and the outlet passage, the fin plate provided between the unit plates.

In the arrangement, by providing the fin plates between the unit plates, the distance between the fins can be extremely small. In addition, the small passages can be narrow and the number of the fins can be increased (for example, doubled), thereby enhancing the performance of the heat exchanger.

A light source device according to an exemplary aspect of the invention includes a light source and a heat exchanger attached to the light source.

In the arrangement, although heat is generated when the light source emits light, the heat is absorbed by the fluid of the heat exchanger, so that the heat of the light source can be absorbed.

In the arrangement, since the heat of the light source can be efficiently absorbed by the heat exchanger, a temperature rise of the light source can be suppressed and the light emission of the light source can be stable. In addition, the light source can have a longer life.

Further, since the heat of the light source can be efficiently absorbed by the heat exchanger, LEDs (light-emitting diodes) or LDs (laser diodes) which generate a large amount of heat from an extremely small area can be employed as a light source of light source devices.

A projector according to an exemplary aspect of the invention includes a light source device; an optical modulator that modulates light irradiated from the light source device in accordance with image data, and a projecting device that projects the light modulated by the optical modulator.

In the arrangement, the light from the light source is modulated by the light modulator. The modulated light is projected by the projecting device and an image is projected on, for example, a screen.

In the arrangement, since the heat of the light source can be efficiently absorbed by the heat exchanger, an increase in temperature of the light source can be suppressed and the light emission of the light source can be stable. In addition, the light source can have a longer life. Thereby, the performance of the projector can be enhanced. Further, since the heat of the light source can be efficiently absorbed by the heat exchanger, LEDs (light-emitting diodes) or LDs (laser diodes) which generate a large amount of heat from an extremely small area can be employed as a light source of light source devices. As a result, luminance of the image by the projector can be high.

An electronic apparatus according to an exemplary aspect of the invention includes the aforesaid heat exchanger and an electronic device that is attached to the heat exchanger and generates heat during operation.

In such an arrangement, the heat from the electronic device can be efficiently absorbed by the heat exchanger. As a result, an increase in temperature of the electronic device can be suppressed and the operation of the electronic device can be stable. Further, the electronic device can have a longer life.

BRIEF DESCRIPTION OF THE DRAWINGS

FIG. 17 shows an arrangement in which a heating body is an electronic device of a second modification of the invention.

DESCRIPTION OF EXEMPLARY EMBODIMENT(S)

Figure 1:
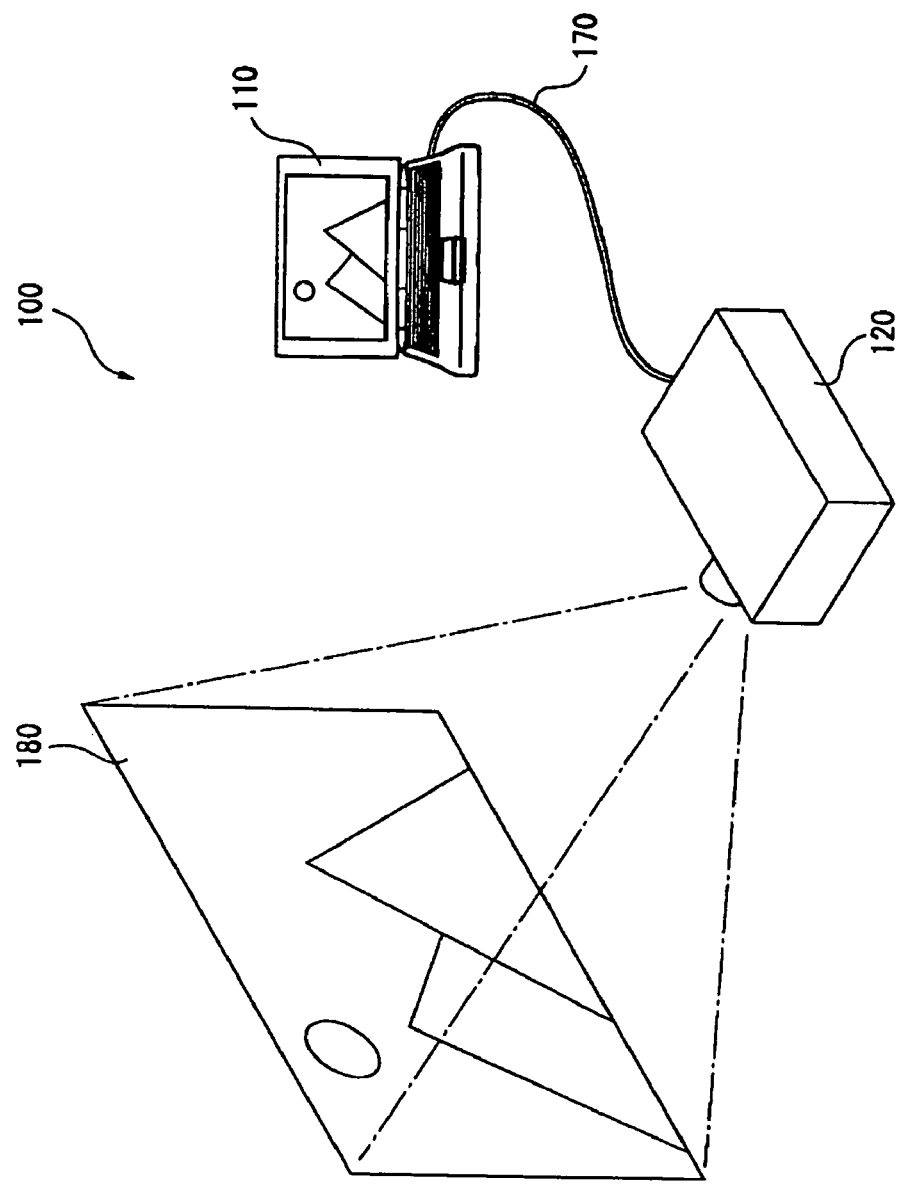
FIG. 1 shows an appearance of a projection system of a first exemplary embodiment of the invention.

Exemplary embodiments of the invention are illustrated in the attached drawings and will be described below with reference to the reference numerals assigned to elements in the drawings.

First Exemplary Embodiment

A first exemplary embodiment will be described.

FIG. 1 shows an appearance of a projection system 100.

The projection system 100 includes a personal computer (an information processor) 110 which outputs an image data signal based on an image of image source, a projector (an image display device) 120 which generates a present image frame based on the image data signal from the personal computer 110 and projects the generated present image frame onto a screen 180 and a USB cable (a signal transmitter) 170 which connects the projector 120 and the personal computer 110.

Figure 2:
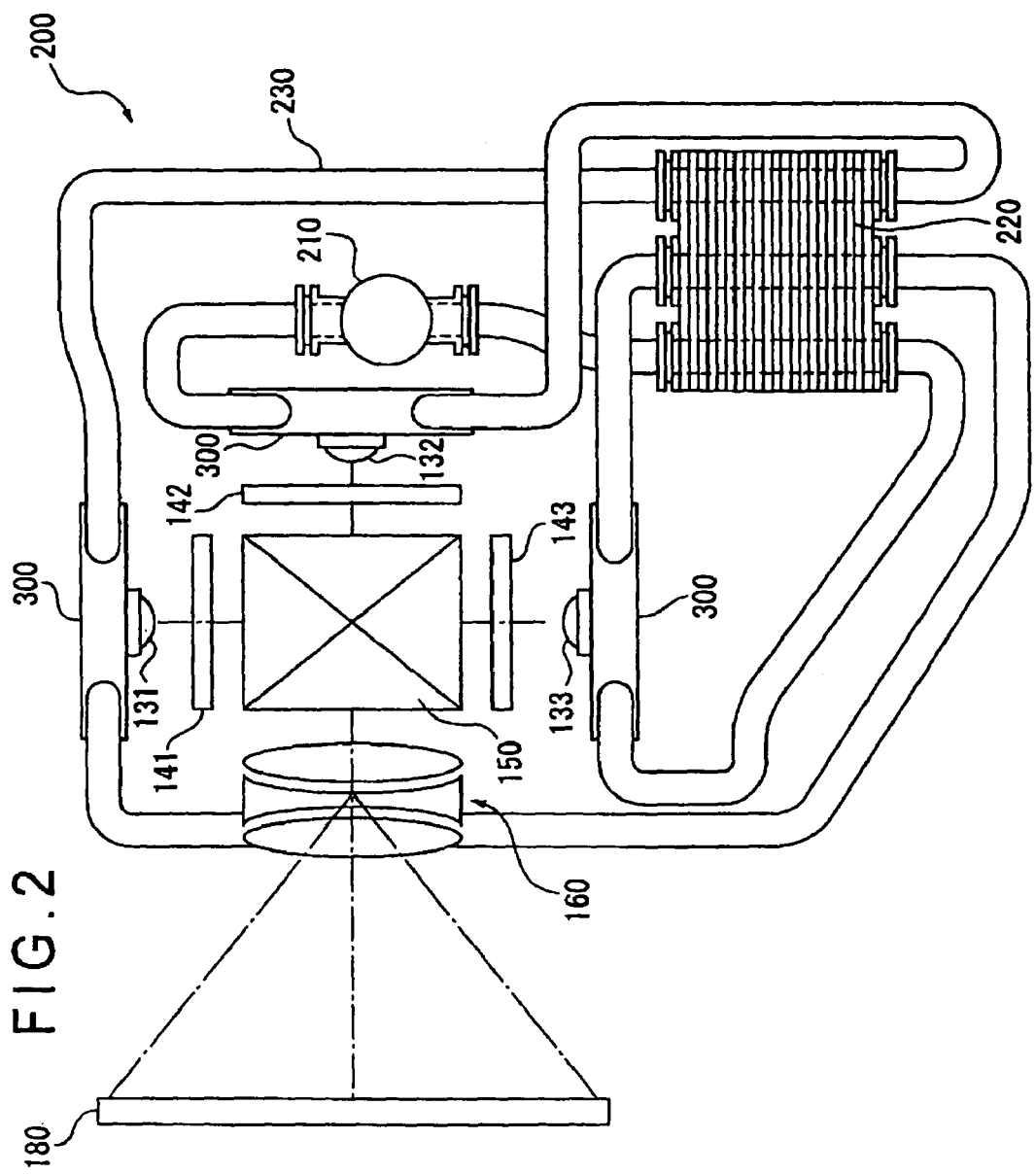
FIG. 2 shows an inner structure of a projector of the first exemplary embodiment.

FIG. 2 shows an inner structure of the projector 120.

The projector 120 includes LEDs (light sources, heating bodies) 131 to 133 which respectively emit color light of R (red), G (green) and B (blue), liquid crystal panels (optical modulators) 141 to 143 which modulate the light from the LEDs 131 to 133, a prism 150 which combines the light modulated by the liquid crystal panels 141 to 143, a projection optical system (a projecting device) 160 which projects the combined light onto the screen 180 and a heat absorbing mechanism 200 which absorbs heat generated by the LEDs 131 to 133.

The LEDs 131 to 133 are respectively provided for the colors. Specifically, the LEDs 131 to 133 are a red color LED 131, a green color LED 132 and a blue color LED 133.

The LEDs 131 to 133 are heat generating bodies which generate a large amount of heat from a small area. Accordingly, the heat of the LEDs 131 to 133 needs to be absorbed in order to stabilize the colors of the light emitted from the LEDs 131 to 133 or to prevent damage on the LEDs 131 to 133.

The liquid crystal panels as the optical modulators are a red color liquid crystal panel 141, a green color liquid crystal panel 142 and a blue color liquid crystal panel 143 which are disposed so as to face the LEDs 131 to 133 of respective colors.

The liquid crystal panels 141 to 143 are driven by a predetermined drive signal in accordance with image information. The liquid crystal panels 141 to 143 modulate the light from the LEDs 131 to 133 for each pixel. The light from the liquid crystal panels 141 to 143 is combined by the prism 150 to form an image. The combined image is irradiated from the projection optical system 160 and projected on the screen 180 in an enlarged manner.

The heat absorbing mechanism 200 includes heat exchangers 300 which are attached on rear surfaces of the LEDs 131 to 133 and absorb the heat from the LEDs 131 to 133, a pump 210 for supplying a cooling medium to the heat exchangers 300, a radiator 220 which releases heat of the cooling medium and a pipe 230 which connects the heat exchangers 300, the pump 210 and the radiator 220.

The heat exchangers 300 are respectively attached on the rear surfaces of the red color LED 131, the green color LED 132 and the blue color LED 133.

Figure 3:
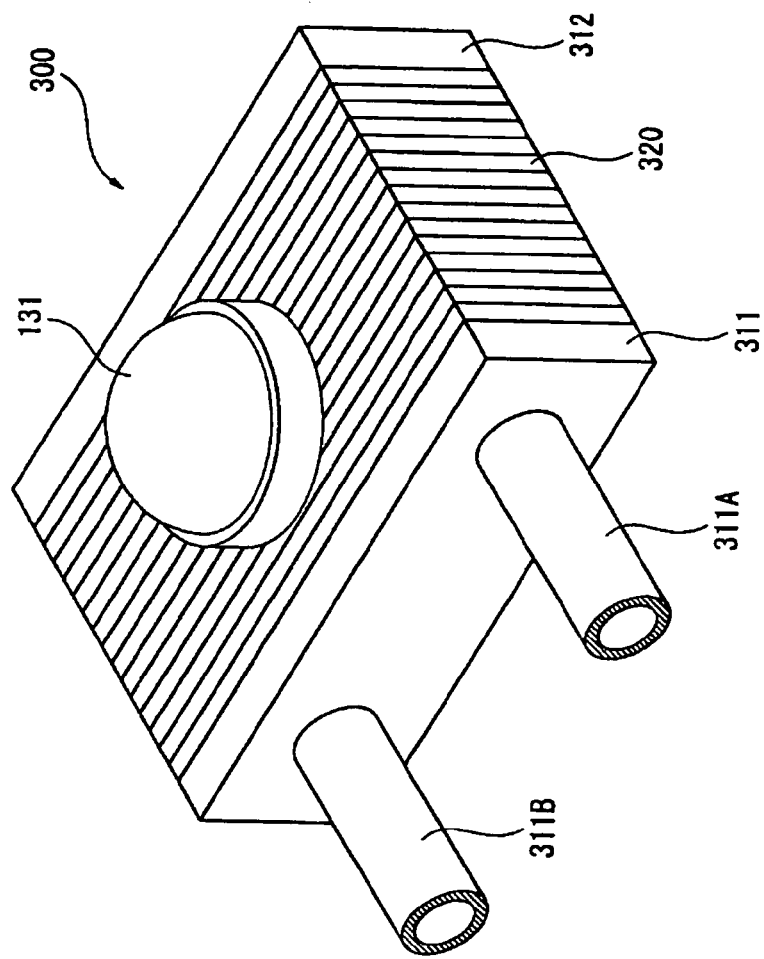
FIG. 3 shows an appearance of a heat exchanger on which an LED is attached of the first exemplary embodiment.
Figure 4:
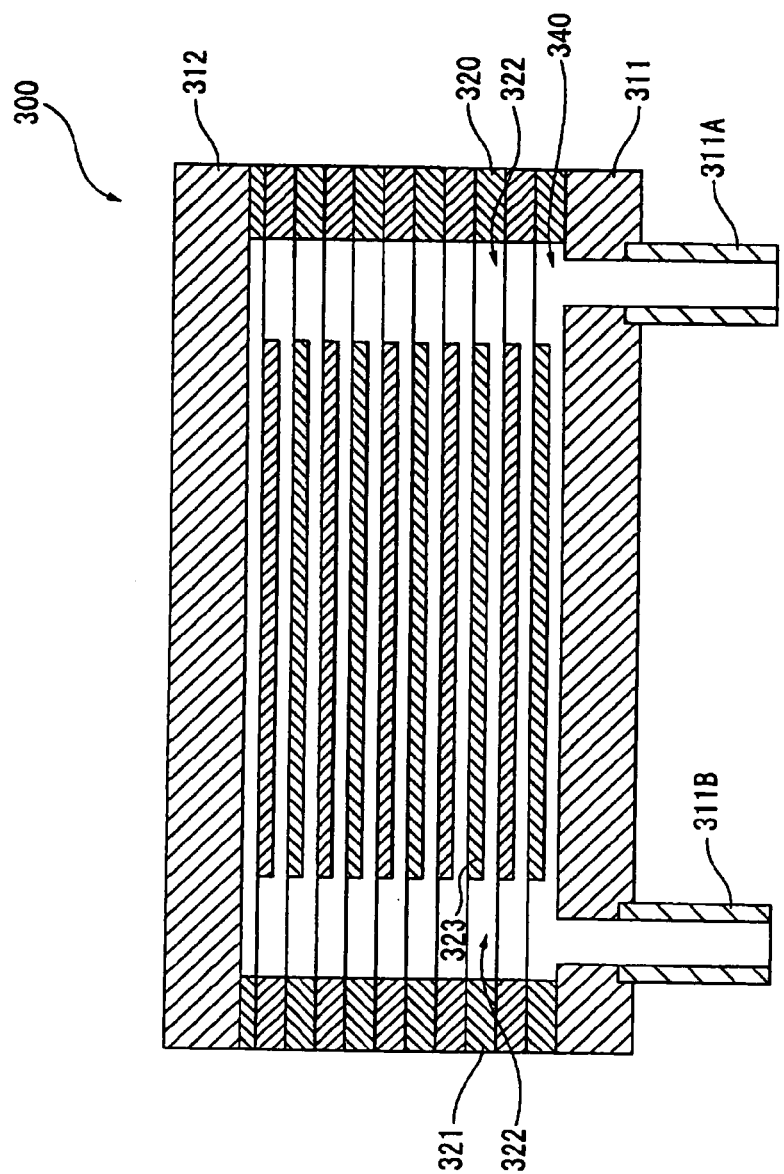
FIG. 4 is a cross section of the heat exchanger of the first exemplary embodiment.

FIG. 3 shows an appearance of the heat exchangers 300 on which the LEDs 131 to 133 are attached. FIG. 4 is a cross section of the heat exchangers 300.

The heat exchangers 300 each include two end plates 311, 312 and a plurality of unit plates 320 layered on each other between the two end plates 311, 312.

The heat exchangers 300 are made of a metal having a high thermal conductivity such as copper, aluminum or an alloy of copper or aluminum.

The two end plates 311, 312 have a rectangular thin flat plate shape.

The end plate 311 on a front side out of the two end plates is provided with two nozzles 311A, 311B for connecting with the pipe 230. The two nozzles 311A, 311B are respectively disposed near ends of the end plate 311.

The nozzle 311A is an inlet nozzle (an inlet passage) into which the cooling medium flows. The nozzle 311B is an outlet nozzle (an outlet passage) from which the cooling medium is discharged.

Figure 5:
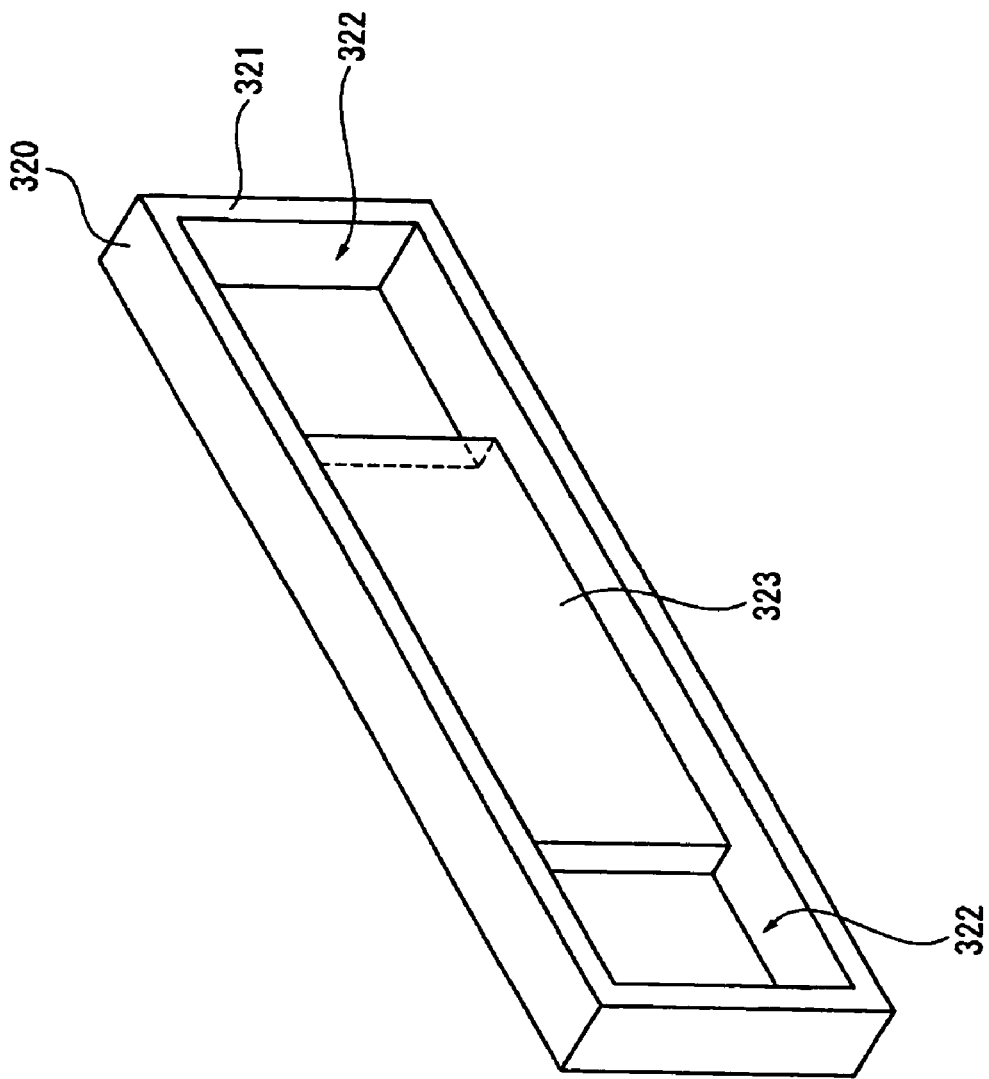
FIG. 5 is a perspective view of a unit plate of the first exemplary embodiment.

FIG. 5 is a perspective view of the unit plates 320.

As shown in FIG. 5, the unit plates 320 each are a thin plate in a substantially same shape as a whole as that of the end plates 311, 312. The unit plates 320 each include a frame 321, holes 322 and a fin 323. The frame 321 has a thickness of about 100 μm. The frame 321 encloses a center portion at an outer periphery of the unit plate 320.

The holes 322 are formed so as to penetrate the unit plate 320 at ends in a lengthwise direction of the unit plate 320, the holes 322 being on inner sides of the frame 321.

The fin 323 has a smaller thickness than the frame 321, the thickness being about a half of that of the frame 321. The fin 323 is not provided on a rear surface side of the unit plate 320 out of a front surface side and the rear surface side of the unit plate 320. Specifically, the frame 321 projects toward the front surface side from the fin 323 by about 50 μm.

Figure 6:
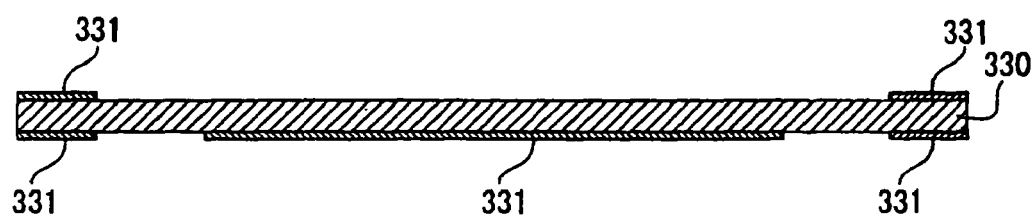
FIG. 6 is an illustration for explaining a manufacturing process of the unit plate of the first exemplary embodiment.
Figure 7:
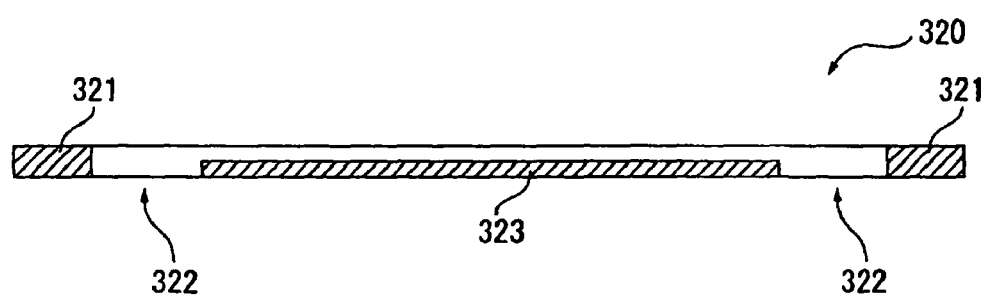
FIG. 7 is an illustration for explaining the manufacturing process of the unit plate of the first exemplary embodiment.

FIGS. 6 and 7 are illustrations for explaining a manufacturing process of the unit plates 320.

The manufacturing process of the unit plates 320 will be described with reference to FIGS. 6 and 7.

Firstly, a thin plate 330 having a thickness of about 100 μm and a rectangular shape is prepared. Both of front and rear surfaces of a portion to be the frame 321 of the thin plate 330 are provided with masks 331. Only one surface of a portion to be the fin 323 of the thin plate 330 is provided with the mask 331. No mask 331 is provided on portions to be the holes 332 of the thin plate 330. Accordingly, the thin plate 330 is provided with the masks 331 as shown in FIG. 6.

In this state, the thin plate 330 is dipped in a dissolving solution. In the dissolving solution, a portion provided with no mask 331 begins to be dissolved. The portions for the holes 332 begin to be dissolved from both surfaces while the portion for the fin 323 begins to be dissolved from one surface.

By picking up the thin plate 330 from the dissolving solution when the holes 332 penetrate the thin plate 330 and the thickness of the fin 323 is the half of the thin plate 330, the formed unit plate 320 that has the holes 332 and the fin 323 having the half thickness of that of the frame 321 can be obtained as shown in FIG. 7. The unit plate 320 has a C-shape in cross section.

The thus obtained unit plates 320 and the separately prepared end plates 311, 312 are layered and integrated by diffusion bonding. Then, the nozzles 331A, 331B are fixed, thereby completing the heat exchanger 300.

As shown in FIG. 4, in the assembled heat exchanger 300, a communication space 340 is defined by the frames 321 of the unit plates 320.

In the communication space 340, the fins 323 of the unit plates 320 are aligned at a small interval, forming small passages between the fins 323.

Since the LEDs 131 to 133 are attached on upper surfaces of the heat exchangers 300, the upper surfaces of the heat exchangers 300 are processed to be smooth such that the heat exchangers 300 can firmly stick to the LEDs 131 to 133. When the cooling medium is flown from the inlet nozzle 311A, the cooling medium flows through the small passages between the fins 323 to the outlet nozzle 311B and is discharged from the outlet nozzle 311B to the outside of the heat exchanger 300.

As shown in FIG. 2, the three heat exchangers 300 with the LEDs 131 to 133 attached thereon and the pump 210 are parallel connected by the pipe 230. The radiator 220 is provided on the pipe 230, so that the heat of the cooling medium is released by the radiator 220.

Next described will be an operation of the projection system 100 that has the above-stated arrangement.

When the projector 120 is turned ON, a voltage is applied on the LEDs 131 to 133 to light the LEDs 131 to 133. Thereby, the LEDs 131 to 133 emit the light of the colors and generate heat.

When the projector 120 is turned ON, the pump 210 is also operated. Accordingly, the cooling medium is supplied from the pump 210 through the pipe 230 to the three heat exchangers 300.

The heat generated by the LEDs 131 to 133 is transferred to the upper surfaces of the heat exchangers 300 and to the fins 323 of the unit plates 320. The cooling medium flown from the inlet nozzle 311A flows through the small passages between the fins to the outlet nozzle 311B. During flowing, the heat of the fins 323 is transferred to the cooling medium in a contact between the fins 323 and the cooling medium. The cooling medium which has become hot is discharged from the outlet nozzle 311B and flows through the pipe 230 to be introduced to the radiator 220. The radiator 220 releases the heat of the cooling medium.

In such a cycle, in the state in which the heat of the LEDs 131 to 133 is absorbed and a temperature rise of the LEDs is suppressed, the LEDs 131 to 133 are maintained so as to light in a good condition.

To project an image on the screen 180, image source is firstly input to the personal computer 110. The image source is image-processed in a predetermined manner and an image data signal is generated. The image data signal is transferred from the personal computer 110 to the projector 120. Present image data is generated from the image data signal in the projector 120, and a drive signal is provided to the liquid crystal panels 141 to 143 to display the present image data The light from the LEDs 131 to 133 is modulated by the liquid crystal panels 141 to 143 for each pixel and the modulated light is combined by the prism 150. Thereby, an image is generated. The generated image is projected from the projection optical system 160 onto the screen 180, so that the image is shown on the screen 180.

According to the first exemplary embodiment, following effects can be obtained.

As a first effect, since the plurality of fin 323 are disposed in the communication space in which the cooling medium flows, a contact area between the fins 323 and the cooling medium can be large and the heat exchange efficiency can be enhanced.

As a second effect, since the fins 323 and the frames 321 are integrally formed in the unit plates 320, one small passage can be formed by jointing two unit plates 320 on one joint surface. In other words, one small passage can be formed by only one joint portion, so that the number of the joint portions can be a half of that of the related art. Since the number of the joint portions can be halved, the thermal conductivity of the heat exchangers 300 can be enhanced, so that the heat of the LEDs 131 to 133 can be efficiently transferred to the fins 323 of the unit plates 320. As a result, the heat can be transferred from the fins 323 to the cooling medium, so that the heat exchangers 300 can have high heat exchange efficiency.

As a third effect, since the fins 323 and the frames 321 are integral, the number of components and assembling work can be half compared with the related art. Hence, the heat exchangers 300 can be manufactured at low cost while having a high performance. As a fourth effect, the heat of the LEDs 131 to 133 can be efficiently absorbed by the heat exchangers 300, an increase in temperature of the LEDs 131 to 133 can be suppressed and the LEDs 131 to 133 can provide stable light emission and have a longer life. In addition, since the heat of a light source can be efficiently absorbed by the heat exchangers 300, a light source such as the LEDs (light-emitting diodes) 131 to 133 which generate a large amount of heat from a small area can be used. As a result, luminance of the image of the projector 120 can be high.

Second Exemplary Embodiment

A second exemplary embodiment will be described with reference to FIGS. 8 to 10.

The second exemplary embodiment has a basic structure similar to that of the first exemplary embodiment but has a feature in which unit plates 420 have an I-shape in cross section.

Figure 8:
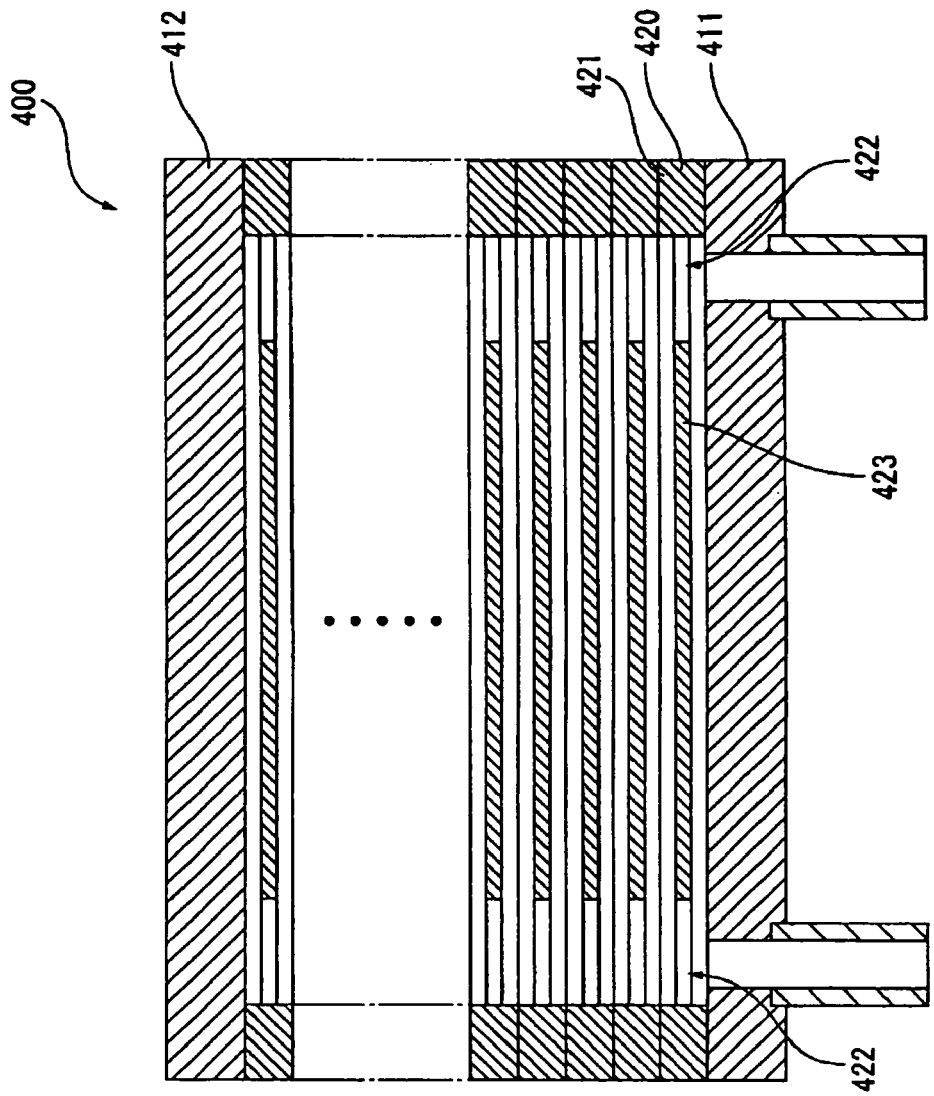
FIG. 8 is a cross section of a second exemplary embodiment of the invention.

FIG. 8 is a cross section of the second exemplary embodiment.

Figure 9:
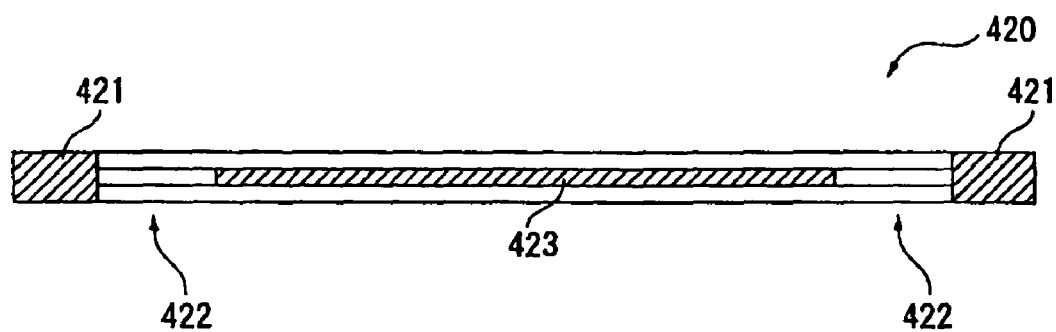
FIG. 9 shows a unit plate of the second exemplary embodiment.

FIG. 9 shows the unit plate 420 of the second exemplary embodiment.

In FIG. 8, a heat exchanger 400 includes the two end plates 411, 412 and the plurality of unit plates 420 layered on each other between the two end plates 411, 412. The unit plates 420 each include a frame 421, holes 422 and a fin 423, which is the same as the first exemplary embodiment. However, in the second exemplary embodiment, as shown in FIG. 9, the frame 421 is formed to project toward both of the front surface side and the rear surface side of the fin 423. The frame 421 has a height of about 10 to 50 μm relative to the fin 423.

Figure 10:
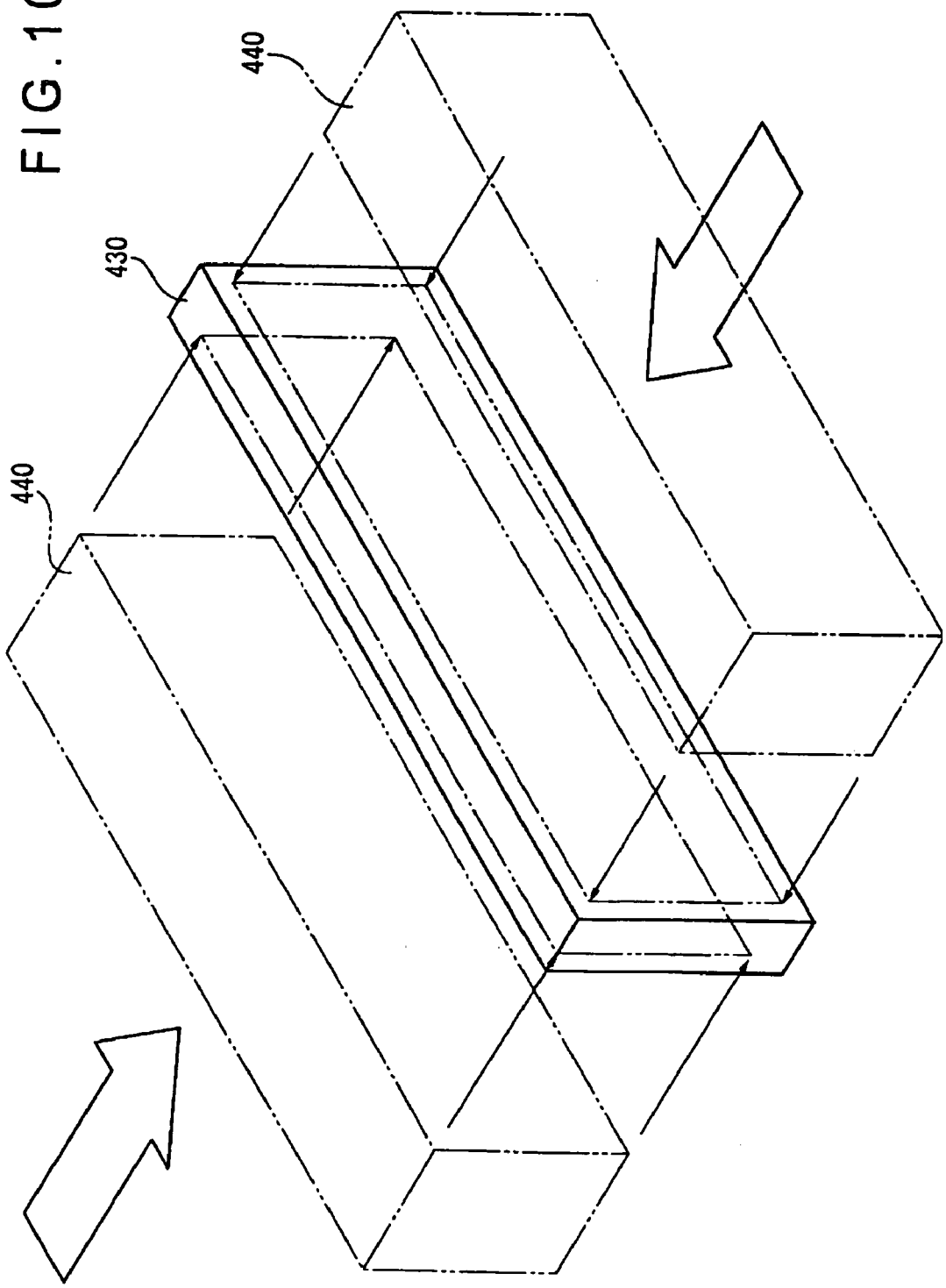
FIG. 10 is an illustration for explaining a manufacturing process of the unit plate of the second exemplary embodiment.

FIG. 10 is an illustration for explaining a manufacturing process of the unit plates 420.

To manufacture the unit plates 420, a thin plate 430 having a thickness of about 100 μm is prepared. The thin plate 430 is pressed from both of a front surface and a rear surface thereof by a press die 440 having a pressing surface corresponding to the fin 423. Thereby, the fin 423 is compressed to be thin, so that the frame 421 projects from the front and rear surfaces of the fin 423 by an amount in which the fin 423 is reduced. Thus, the unit plate 420 is formed into the I-shape in cross section. Note that the holes 422 may be punched at the same time of the pressing or may be formed by etching.

According to the second exemplary embodiment, following effects can be obtained in addition to the effects of the first exemplary embodiment.

As a fifth effect, the heat exchanger 400 can be formed by layering the unit plates 420 of the I-shape in cross section on each other and forming small passages between the fins 423.

As a sixth effect, in forming the unit plates 420, since the thin plate 430 is pressed such that the frame 421 projects by the amount in which the fin 423 is reduced to be thin by pressing the thin plate 430, a height of the frame 421 (an projecting height from the fin 423) can be extremely thin. Hence, when the unit plates 420 are layered, the fins 423 can be disposed with a small distance from each other, thereby narrowing the width of the small passages. As a result, since the contact area between the fins 423 and the cooling medium can be increased, the thermal conductivity from the fins 423 to the cooling medium can be enhanced, thereby improving the performance of the beat exchanger 400.

Third Exemplary Embodiment

A third exemplary embodiment of the invention will be described with reference to FIG. 11.

The third exemplary embodiment has a basic structure similar to that of the second exemplary embodiment but has a feature in which fin plates 450 are disposed between the unit plates 420.

Figure 11:
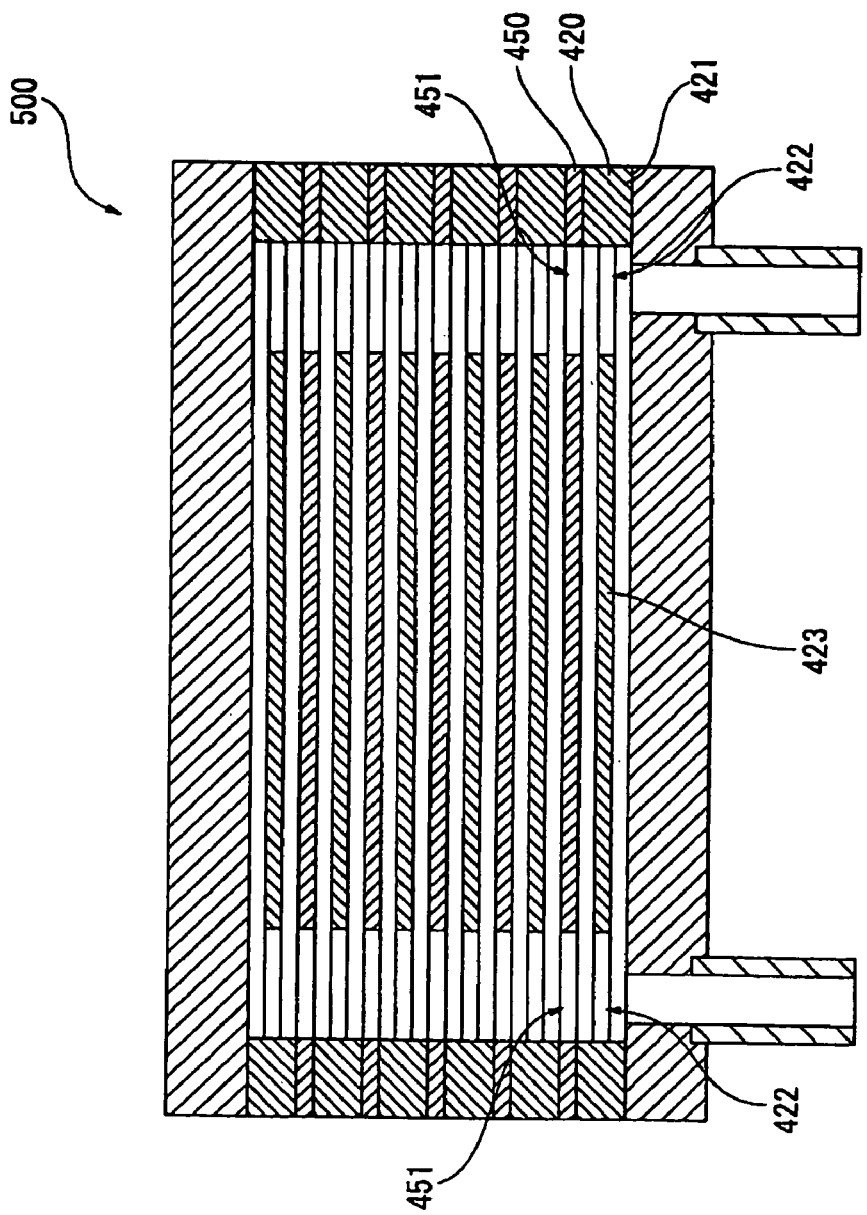
FIG. 11 is a cross section of a third exemplary embodiment of the invention.

FIG. 11 is a cross section of the third exemplary embodiment.

In FIG. 11, a heat exchanger 500 is the same as the second exemplary embodiment in that the unit plates 420 in the I-shape in cross section are layered to form the heat exchanger but has a feature in which the fin plates 450 are provided between the unit plates 420.

The fin plates 450 each are a thin plate having a similar thickness to that of the fins 423 of the unit plates 420 and two holes 451, 451 are formed so as to penetrate through the fin plates 450. In other words, the fin plates 450 is equal to the unit plates 420 with the frame 421 removed.

By providing such fin plates 450 between the unit plates 420, the distance between the fins can be a half of that of the second exemplary embodiment and the small passages can be narrow. Further, the number of the fins is doubled.

According to the third exemplary embodiment, following effects can be obtained in addition to the effects of the above-described exemplary embodiments. As a seventh effect, by providing the fin plates 450 between the unit plates 420, the distance between the fins can be extremely narrow.

In addition, since the small passages can be narrow and the number of the fins can be doubled, the heat exchanger 500 can have a high performance.

Fourth Exemplary Embodiment

A fourth exemplary embodiment will be described with reference to FIGS. 12 to 13.

The fourth exemplary embodiment has a basic structure similar to that of the second exemplary embodiment but has a feature in which a unit plate 620 has a Z-shape in cross section.

Figure 12:
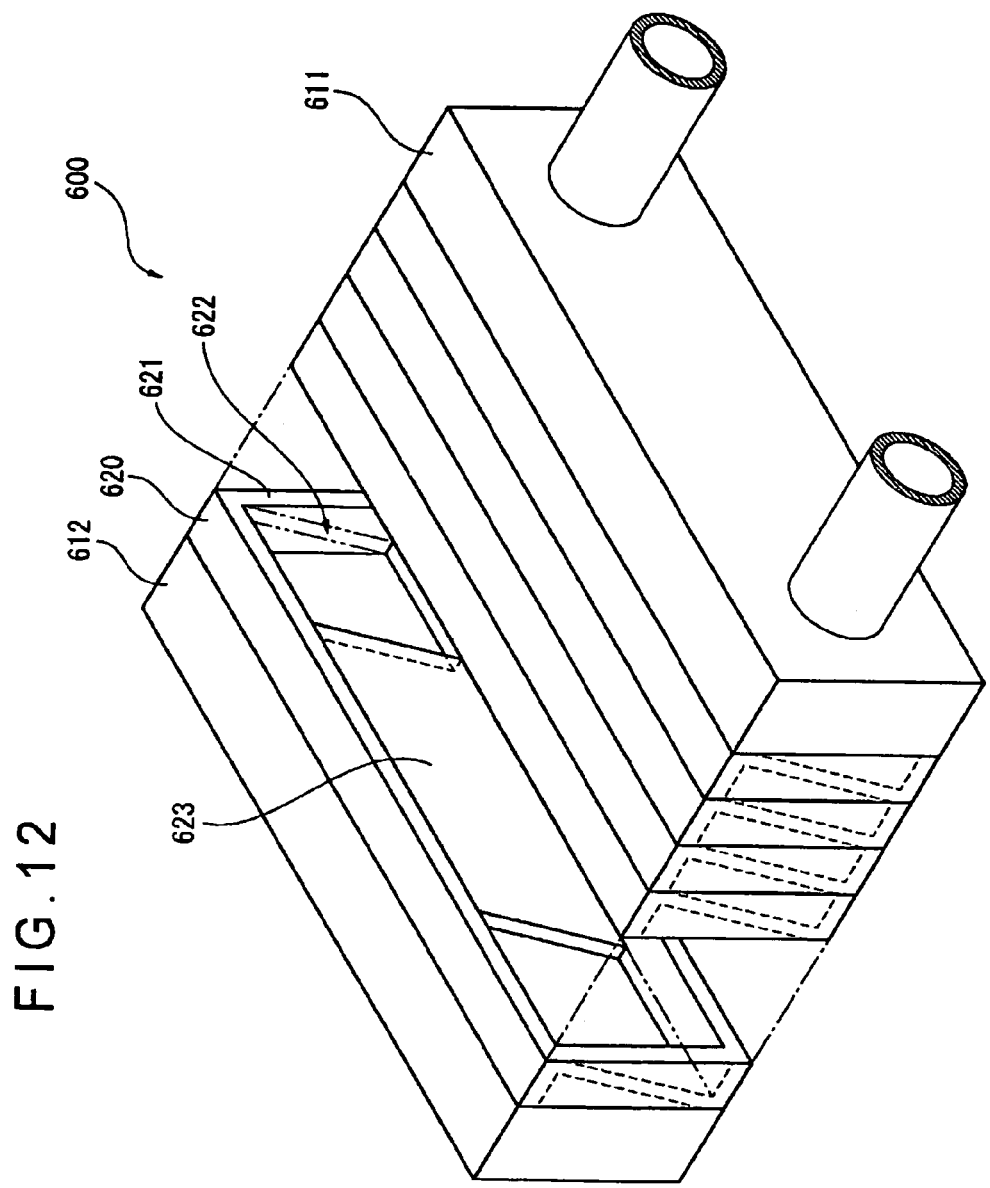
FIG. 12 is a perspective view with some unit plates removed such that how the unit plates are layered can be understood in a fourth exemplary embodiment of the invention.

FIG. 12 is a perspective view with some unit plates 620 removed such that how the unit plates 620 are layered can be understood in the fourth exemplary embodiment.

Figure 13:
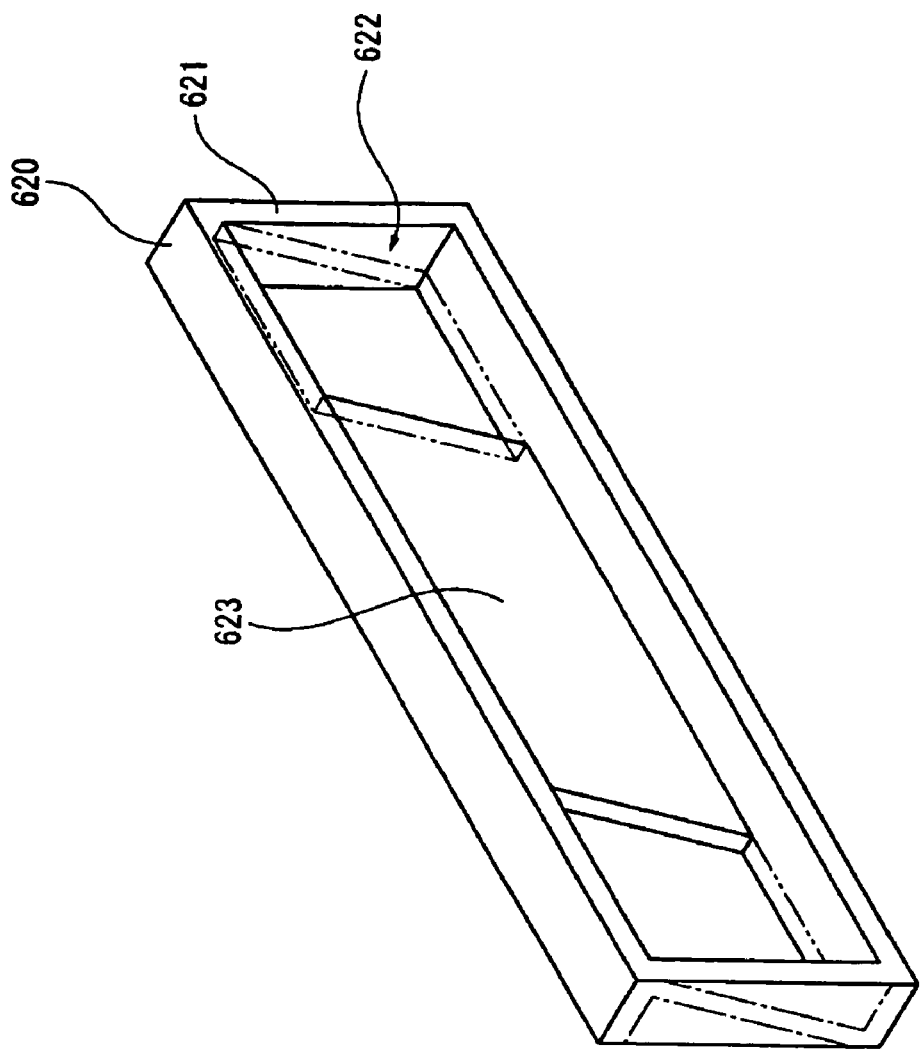
FIG. 13 is a perspective view of the unit plate of the fourth exemplary embodiment of the invention.

FIG. 13 is a perspective view of the unit plates 620 of the fourth exemplary embodiment.

In FIG. 12, the heat exchanger 600 includes two end plates 611, 612 and the plurality of unit plates 620 layered on each other between the two end plates 611, 612.

The unit plates 620 each include a frame 621, holes 622 and fins 623, which is the same as the second exemplary embodiment. However, in the fourth exemplary embodiment, as shown in FIG. 13, the frame 621 is formed to project toward both of the front surface side and the rear surface side of the fin 623.

The fin 623 is slant relative to the projection direction of the frame 621.

When seen from a lateral side in the lengthwise direction of the unit plate 620, the fin is provided in parallel to a diagonal line of the rectangular unit plate 620, so that the unit plate 620 has the Z-shape in cross section.

Since the fin 623 is slant relative to the unit plate 620, the vertical length of the fin 623 becomes large and the area of the fin 623 becomes large.

According to the fourth exemplary embodiment, following effects can be obtained in addition to the effects of the above-described exemplary embodiments. As an eighth effect, since the fin 623 is slant relative to the frame 621, the area of the fin 623 can be large, so that the contacting area of the fluid and the fin 623 is increased by an increased amount of the area of the fin 623, thereby enhancing the thermal conductivity from the fin 623 to the fluid.

Fifth Exemplary Embodiment

A fifth exemplary embodiment will be described with reference to FIGS. 14 to 15.

The fifth exemplary embodiment has a basic structure similar to that of the fourth exemplary embodiment but has a feature in which a frame 721 is a parallelogram and a fin 723 projects from a position substantially on a diagonal line of the frame 721.

Figure 14:
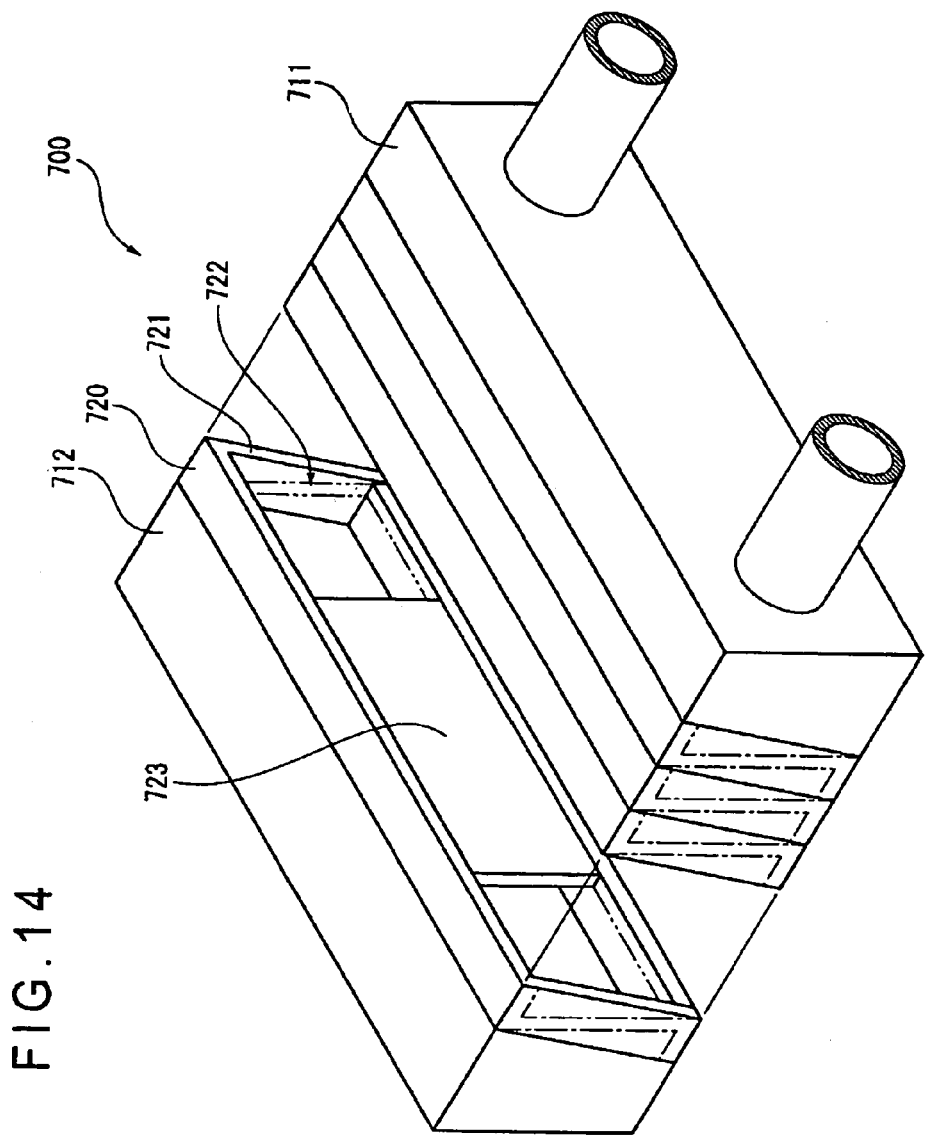
FIG. 14 is a perspective view with some unit plates removed such that how the unit plates are layered can be understood in a fifth exemplary embodiment of the invention.

FIG. 14 is a perspective view with some unit plates 720 removed such that how the unit plates 720 are layered can be understood in the fifth exemplary embodiment.

Figure 15:
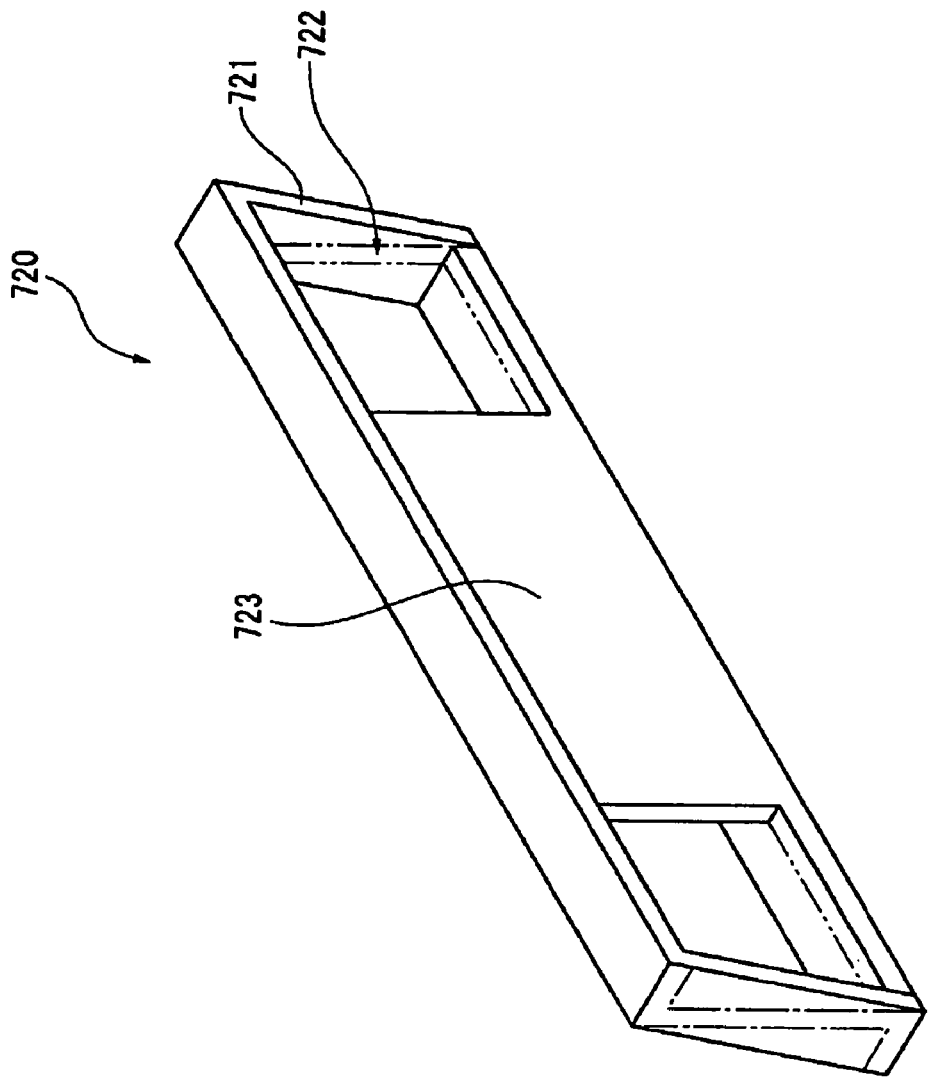
FIG. 15 is a perspective view of the unit plate of the fifth exemplary embodiment.

FIG. 15 is a perspective view of the unit plates 720 of the fifth exemplary embodiment.

In FIG. 14, a heat exchanger 700 includes end plates 711, 712 and unit plates 720. The unit plates 720 each include a frame 721 and a fin 723, and the frame 721 is formed so as to project toward both of the front surface side and the rear surface side of the fin 723.

The projecting direction of the frame 721 and a surface of the fin 723 are orthogonal to each other. When seen from a lateral side in the lengthwise direction of the unit plate 720, the fin is provided in parallel to a diagonal line of the parallelogram unit plate 720.

By layering such unit plates 720, the heat exchanger 700 can be formed, in which a large number of fins are provided in the communication space with a small distance from each other.

First Modification

A first modification of the invention will be described with reference to FIG. 16.

Figure 16:
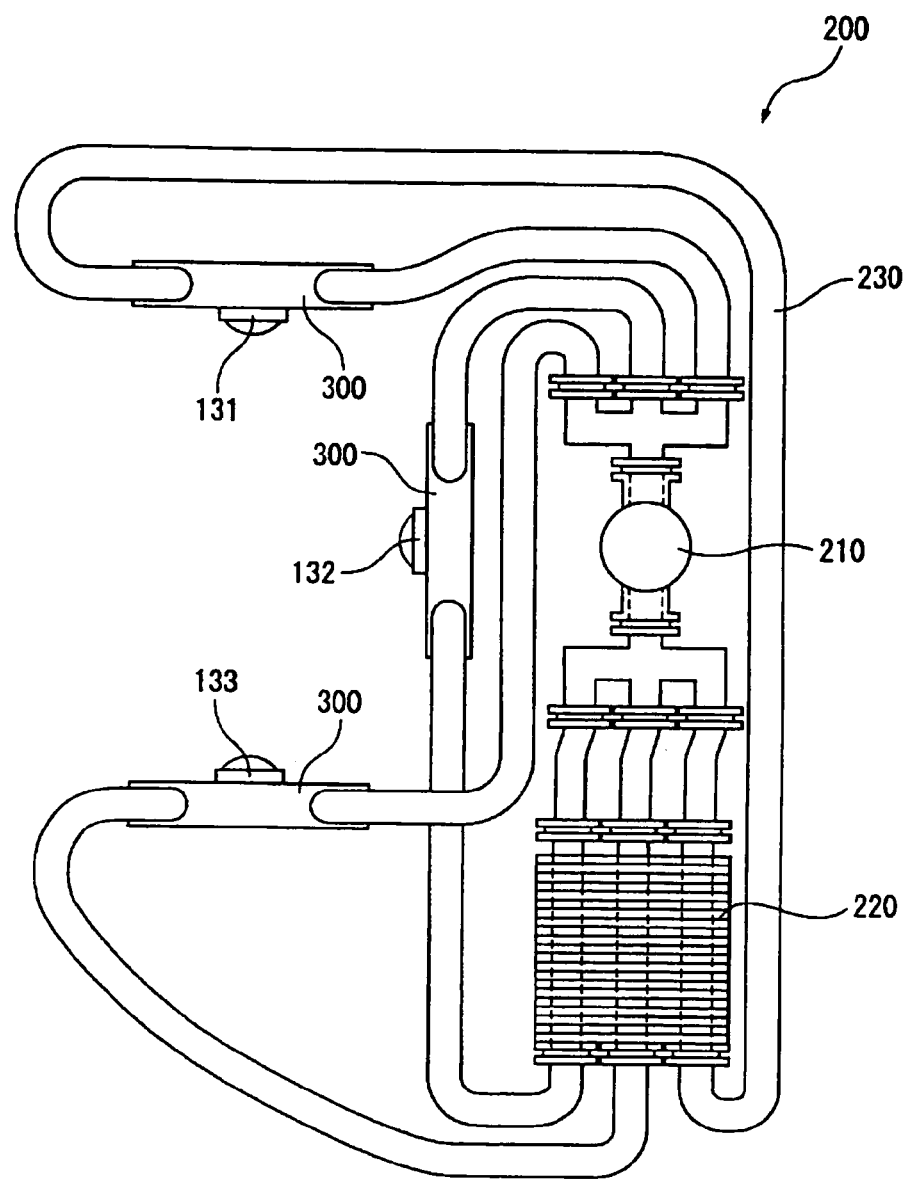
FIG. 16 shows a piping structure in which heat exchangers are parallel connected of a first modification of the invention.

In the above-described exemplary embodiments, the pipe 230 of the heat absorbing mechanism 200 connects the three heat exchangers 300 parallel, but the three heat exchangers 300 may be connected in parallel as shown in the first modification in FIG. 16.

Second Modification

A second modification of the invention will be described with reference to FIG. 17.

The above-described exemplary embodiments have been described by taking as an example a case for absorbing the heat from the light sources. However, heat from another electronic device of the personal computer 110 such as a CPU may be absorbed as shown in FIG. 16. In such an arrangement, the heat from the CPU can be efficiently absorbed by the heat exchangers 300. As a result, an increase in temperature of the CPU can be suppressed and the operation of the CPU can be stable. Further, the CPU can have a longer life.

The scope of the invention is not limited to the above-stated exemplary embodiments and the invention includes modifications, improvements and the like as long as an object of the invention can be obtained.

In the third exemplary embodiment, a case in which the fin plates are interposed between the unit plates is described. However, when disposing the fin plates between the unit plates, the fin plates may be provided for every other unit plates or every three unit plates.

The unit plates in the C-shape in cross section of the first exemplary embodiment and the unit plates in the I-shape in cross section of the second exemplary embodiment may be alternately layered to form the heat exchanger.

An aspect of the invention may be used in a heat exchanger.

What is claimed is:

1. A heat exchanger, comprising:
a housing including
an inlet passage through which a fluid is introduced, an outlet passage from which the fluid is discharged,
an inner communication space in which the fluid flows from the inlet passage to the outlet passage, and
a plurality of unit plates of thin flat plates that are disposed in parallel to a flowing direction of the fluid, the plurality of unit plates layered in a direction to be substantially orthogonal to the flowing direction, the plurality of unit plates each having
a fin in parallel to the flowing direction of the fluid, the fin having a side,
a frame enclosing the fin and projecting in an out-of-plane direction of the fin, and
holes respectively communicating with the inlet passage and the outlet passage, wherein
heat is exchanged between a heating body attached on an outer surface of the housing and the fluid,
the side of the fin of each of the plurality of unit plates is slanted relative to a projecting direction of the frame and is parallel to a side of each of the fins of the rest of the plurality of unit plates, and
the unit plates each have a Z-shape cross section along the direction in which the unit plates are layered.

2. The heat exchanger according to claim 1, further comprising:
a fin plate having a fin in parallel to the flowing direction of the fluid and holes respectively communicating with the inlet passage and the outlet passage, the fin plate provided between the unit plates.

3. A light source device, comprising:
a light source; and
a heat exchanger attached to the light source, the heat exchanger including
a housing having an inlet passage through which a fluid is introduced, an outlet passage from which the fluid is discharged,
an inner communication space in which the fluid flows from the inlet passage to the outlet passage, and
a plurality of unit plates of thin flat plates that are disposed in parallel to a flowing direction of the fluid, the plurality of unit plates layered in a direction to be substantially orthogonal to the flowing direction, the plurality of unit plates each having a fin in parallel to the flowing direction of the fluid, the fin having a side,
a frame enclosing the fin and projecting in an out-of-plane direction of the fin, and holes respectively communicating with the inlet passage and the outlet passage, wherein
heat is exchanged between a heating body attached on an outer surface of the housing and the fluid,
the side of the fin of each of the plurality of unit plates is slanted relative to a projecting direction of the frame and is parallel to a side of each of the fins of the rest of the plurality of unit plates, and
the unit plates each have a Z-shape cross section along the direction in which the unit plates are layered.

4. A projector, comprising:
a light source device, the light source device including
a light source, and
a heat exchanger attached to the light source, the heat exchanger having a housing having an inlet passage through which a fluid is introduced,
an outlet passage from which the fluid is discharged, an inner communication space in which the fluid flows from the inlet passage to the outlet passage, and
a plurality of unit plates of thin flat plates that are disposed in parallel to a flowing direction of the fluid, the plurality of unit plates layered in a direction to be substantially orthogonal to the flowing direction, the plurality of unit plates each having a fin in parallel to the flowing direction of the fluid, the fin having a side
a frame enclosing the fin and projecting in an out-of-plane direction of the fin, and holes respectively communicating with the inlet passage and the outlet passage;
an optical modulator that modulates light irradiated from the light source device in accordance with image data; and
a projecting device that projects the light modulated by the optical modulator, wherein
heat is exchanged between a heating body attached on an outer surface of the housing and the fluid,
the side of the fin of each of the plurality of unit plates is slanted relative to a projecting direction of the frame and is parallel to a side of each of the fins of the rest of the plurality of unit plates, and
the unit plates each have a Z-shape cross section along the direction in which the unit plates are layered.

5. An electronic apparatus, comprising:
an electronic device that generates heat during operation; and
a heat exchanger attached to the electronic device, the heat exchanger having
a housing having an inlet passage through which a fluid is introduced, an outlet passage from which the fluid is discharged,
an inner communication space in which the fluid flows from the inlet passage to the outlet passage, and
a plurality of unit plates of thin flat plates that are disposed in parallel to a flowing direction of the fluid, the plurality of unit plates layered in a direction to be substantially orthogonal to the flowing direction, the plurality of unit plates each having a fin in parallel to the flowing direction of the fluid, the fin having a side, a frame enclosing the fin and projecting in an out-of-plane direction of the fin, and holes respectively communicating with the inlet passage and the outlet passage, wherein heat is exchanged between a heating body attached on an outer surface of the housing and the fluid, the side of the fin of each of the plurality of unit plates is slanted relative to a projecting direction of the frame and is parallel to a side of each of the fins of the rest of the plurality of unit plates, and the unit plates each have a Z-shape cross section along the direction in which the unit plates are layered.

* * * * *